United States Patent
Lambert et al.

(10) Patent No.: US 6,784,668 B1
(45) Date of Patent: Aug. 31, 2004

(54) ELECTRICAL CONDUCTION ARRAY ON THE BOTTOM SIDE OF A TESTER THERMAL HEAD

(75) Inventors: Donald L. Lambert, Manteca, CA (US); John D. Redden, Round Rock, TX (US)

(73) Assignee: Advanced Micro Devices Inc., Sunnyvale, CA (US)

( * ) Notice: Subject to any disclaimer, the term of this patent is extended or adjusted under 35 U.S.C. 154(b) by 356 days.

(21) Appl. No.: 10/040,002

(22) Filed: Nov. 7, 2001

(51) Int. Cl.$^7$ .................. H01H 85/30; G01R 31/02; G01R 31/26; G11C 29/00
(52) U.S. Cl. .............. 324/550; 324/765; 324/757; 714/710; 365/225.7
(58) Field of Search ................. 324/550, 765, 324/754–758, 158.1; 714/733, 718, 724, 736, 710; 365/200, 201, 225.7

(56) References Cited

U.S. PATENT DOCUMENTS

| | | | | |
|---|---|---|---|---|
| 4,281,888 A | * | 8/1981 | Seaman | 439/692 |
| 4,698,589 A | * | 10/1987 | Blankenship et al. | 365/201 |
| 5,952,838 A | * | 9/1999 | Tikhonov | 324/754 |
| 6,215,323 B1 | * | 4/2001 | Rennies et al. | 324/760 |
| 6,250,933 B1 | * | 6/2001 | Khoury et al. | 439/66 |
| 6,252,410 B1 | * | 6/2001 | Fan | 324/550 |
| 6,545,927 B2 | * | 4/2003 | Muller | 365/225.7 |
| 6,586,815 B2 | * | 7/2003 | Ohhashi | 257/529 |

* cited by examiner

Primary Examiner—Anjan K. Deb

(57) ABSTRACT

An apparatus for testing an electrical device which includes fuses has a resilient, compressive, insulating base amounted to the underside of a thermal head. A plurality of conductive elements are mounted to the base in parallel relation. A number of these conductive elements are caused to be brought into contact with and bridge a fuse of the device when the thermal head is brought in dose proximity to the device. The conductive elements cause the fuse to be bridged, so that connection is provided between one side of the fuse and the other.

14 Claims, 3 Drawing Sheets

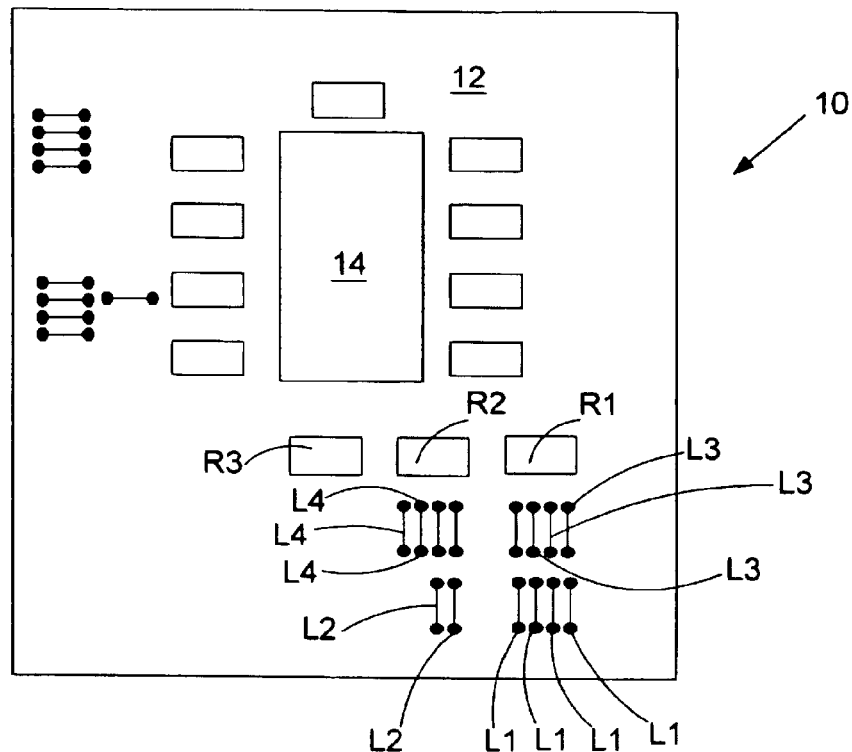
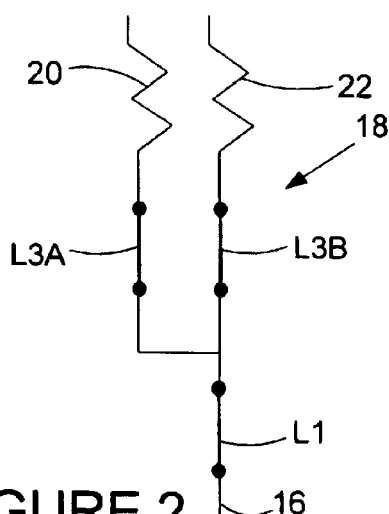 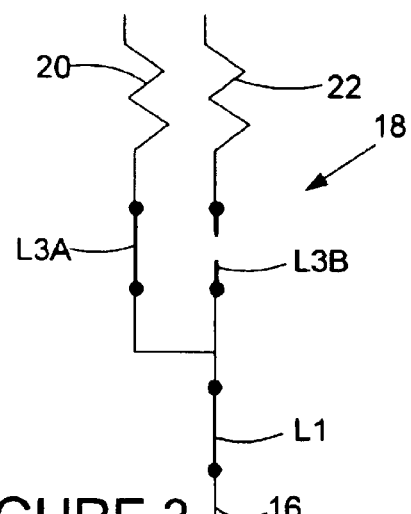
FIGURE 1 (PRIOR ART)
FIGURE 2 (PRIOR ART)
FIGURE 3 (PRIOR ART)

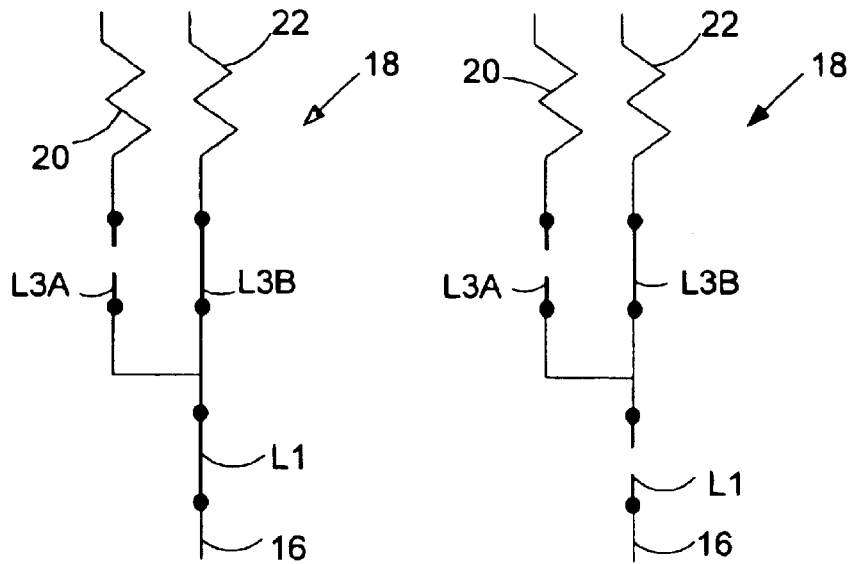
FIGURE 4 (PRIOR ART)
FIGURE 5 (PRIOR ART)
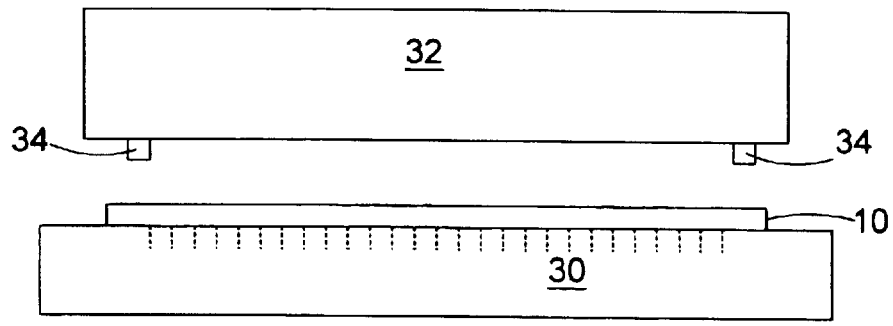
FIGURE 6 (PRIOR ART)
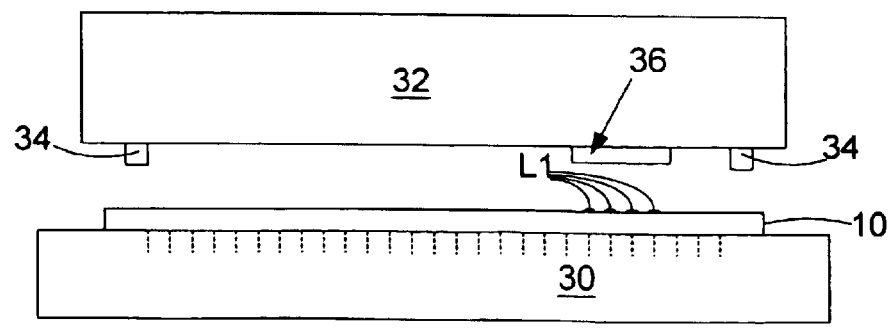
FIGURE 7 (PRIOR ART)

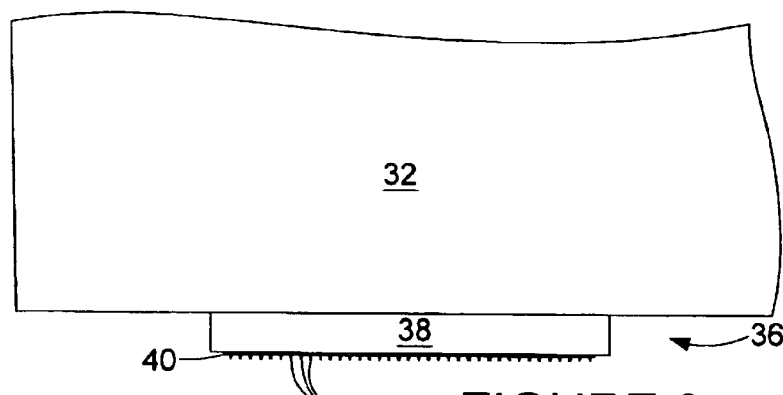
FIGURE 8
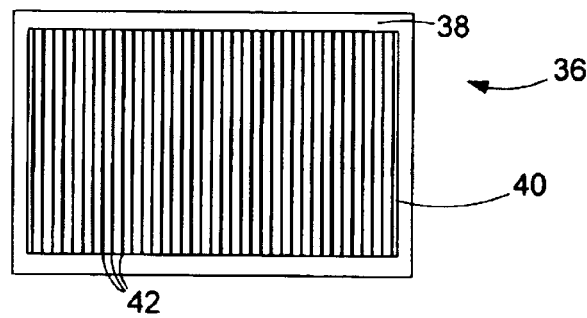
FIGURE 9
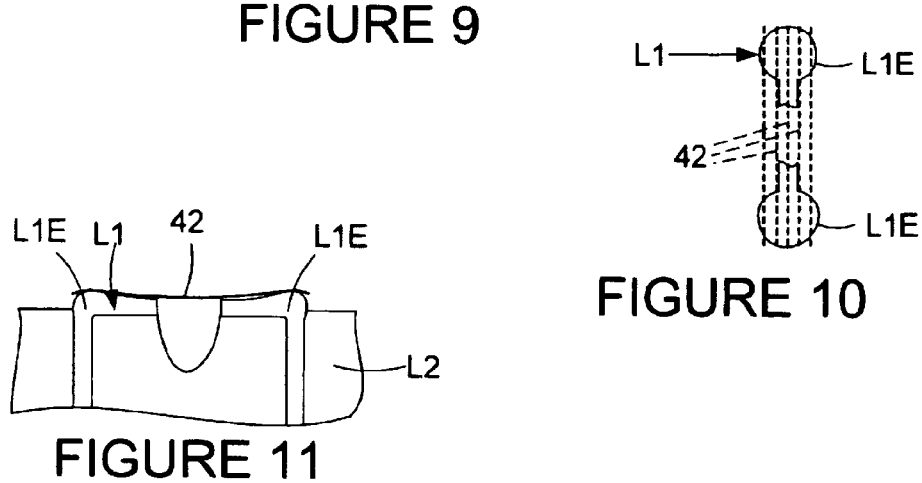
FIGURE 10
FIGURE 11

ELECTRICAL CONDUCTION ARRAY ON THE BOTTOM SIDE OF A TESTER THERMAL HEAD

BACKGROUND OF THE INVENTION

1. Field of the Invention

This invention relates generally to semiconductor devices, and more particularly, to the testing thereof.

2. Discussion of the Related Art

FIG. 1 shows a plan view of a typical pin grid array semiconductor device 10. The device 10 includes a substrate 12 on which is mounted a semiconductor processor 14. Also mounted on the substrate 12 are a plurality of fuses L1, L2, L3, L4 etc. (each of which may be blown by a laser) in operative association with various resistor packs R1, R2, R3 etc. These fuses are used to configure the processor in various ways, for example the frequency of the processor, the voltage thereof, etc. As an example, the fuses L2, L3, L4 are used to configure the frequency of the processor 14. Each of the fuses L1 (one shown in FIG. 2) is connected to a pin 16 of the device 10, and is also connected to a BP pair 18, i.e., (1) a fuse L3A connected in series with a resistor 20, and (2) a fuse L3B connected in series with a resistor 22, the fuse L3A and resistor 20 being in parallel with the fuse L3B and resistor 22. Initially, either the fuse L3B is blown by a laser (FIG. 3), or the fuse L3A is blown by a laser (FIG. 4), the blowing of only fuse L3B resulting in a pull up on the BP pair 18, Mile the blowing of only fuse L3A results in a pulldown on the BP pair 18. Then, each fuse L1 is blown by a laser to disconnect its associated BP pair 18 from the pin 16 (FIG. 5). This ensures that the frequency of the processor 14 cannot be reconfigured thereafter.

Next, a laser level test is undertaken for verification that laser cutting of the fuses L3 has been done correctly. However, because the fuse L1 has been blown, the fuses of each BP pair 18 are no longer connected to a pin of the pin grid array device. Thus, a number of fuses cannot be accessed to verify their state.

What is needed is apparatus which allows fill testing of a device after a laser cutting process has been used to configure the device and pins of the device have been disconnected from internal circuitry thereof.

SUMMARY OF THE INVENTION

The present apparatus for testing an electrical device which includes fuses has a resilient, compressive, insulating base mounted to the underside of a thermal head. A plurality of conductive elements are mounted on the base, in parallel, adjacent but spaced apart relation. With the thermal head in close proximity to the electrical device, a number of the conductive elements are caused to be brought into contact with and bridge a fuse, so that connection is provided between one side of the fuse and the other.

The present invention is better understood upon consideration of the detailed description below, in conjunction with the accompanying drawings. As will become readily apparent to those skilled in the art from the following description, there is shown and described an embodiment of thus invention simply by way of the illustration of the best mode to carry out the invention. As will be realized, the invention is capable of other embodiments and its several detail are capable of modifications and various obvious aspects, all without departing from the scope of the invention. Accordingly, the drawing and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

FIG. 1 is a plan view of a typical pin grid array device;

FIG. 2 is a schematic view of a BP pair of the device in a fist state;

FIG. 3 is a view similar to that shown in FIG. 2, but with the BP pair in a second state;

FIG. 4 is a view s to that shown in FIGS. 2 and 3, but with the BP pair in a third state;

FIG. 5 is a view similar to that showed in FIGS. 2–4, but with the BP pair in a fourth state;

FIG. 6 is a side elevation illustrating use of a thermal head with a typical pin grid array device;

FIG. 7 is a view similar to that shown in FIG. 6, but incorporating the invention;

FIG. 8 is an enlarged to view of a portion of the structure shown in FIG. 7;

FIG. 9 is a view taken along the lines 9—9 of FIG. 8;

FIG. 10 is a plan view of a fuse, wherein use of the present invention is illustrated; and FIG. 11 is a side view of the structure out FIG. 10, wherein use of the present invention is illustrated.

DETAILED DESCRIPTION

Reference is now made in detail to a specific embodiment of the present invention which illustrates the best mode presently contemplated by the inventors for practicing the invention.

FIG. 6 shows a pin grid array device 10 of FIG. 1 mounted to a printed circuit board 30. As is well known a thermal head 32 may be brought adjacent the device 10, with resilient elements 34 mounted to the thermal head 32 compressed against the device 10. The temperature of the thermal head 32 may be increased or decreased as chosen. By changing the temperature of the thermal head 32, the temperature of the device 10 can be adjusted or varied as chosen Then, the device 10 may undergo a variety of electrical test procedures to ensure proper operation.

However, as noted, with for example the fuses L1 blown as described above, certain testing of the device 10 cannot be undertaken because, through the blowing of those fuses L1, pins of the device associated with those fuses L1 are no longer connected to internal circuitry of the device 10. In order to overcome this problem, Apparatus 36 is mounted to the underside of the thermal head 32 as shown in FIGS. 7–9. With reference to FIGS. 8 and 9, the apparatus 36 has a base 38 made up of resilient compressive, insulating material such as soft foam silicone. The base 38 is secured to the underside of the thermal head 32 by means of a suitable adhesive. Mounted to the opposite surface of the base 38 is au adhesive tape body 40 such as Kapton tape having mounted thereon a plurality of conductive, for example gold coated copper, elements 42 in the form of lines which are substantially parallel and in spaced apart relation, and which extend from the surface of the tape body 40 (the tape body 40 and elements 42 make up what is known as a "zebra connector", a readily available commercial product). The edges of the zebra connector body 40, and in turn the conductive elements 42, he within and are spaced from the periphery of the base 38.

With the thermal head 32 in the position relative to the device 10 as shown in FIG. 7 (similar to positions shown in FIG. 6), the apparatus 36 is positioned on the underside of the thermal head 32 so as to directly overlie the fuses L1, with the longitudinal axes of the elements 42 lying substantially parallel to the longitudinal axes of the fuses L1. Then, with the thermal head 32 adjacent the device 10, with resilient elements 34 compressed against the device 10 as described above, the elements 42 contact the fuses L1, with one or more of the elements 42 bridging each fuses L1(one shown in FIGS. 10 and 11). The spacing between adjacent elements 42 is chosen relative to the dimensions of the fuse L1 so that as many as five elements 42 provide conductive bridging of the fuse L1 between the ends L1E thereof. With such a configuration, a degree of lateral and/or rotational misalignment between the thermal head 32 and the device 10 can be accommodated, meanwhile with bridging of fuse L1 being provided. Furthermore, because of the softness and resilience of the base 38, each element 42, being flexible in itself, will conform to an extent to the irregularities in the surface of the fuse (FIG. 11), insuring that proper contact is made to the ends L1E of the fuse L1 so as to provide proper conductive bridging thereof.

It will be understood that the position of fuses may be different for different devices. It will therefore in turn be understood that the positioning and orientation of the apparatus 36 on the underside of the thermal head 32 is chosen so that it properly overlies and can provide proper bridging of chosen fuses of the device 10. Indeed, multiple such apparatuses 36 can be provided on the underside of the thermal head 32 as appropriate.

Through bridging of blown fuses as described above, full electrical testing of the device can be undertaken, because, for such testing purposes, the pins of the device 10 are no longer cut off from internal circuitry, which would be the state of the device 10 without such bridging of blown fuses. Thus, 100 percent verification of the state of all fuses downstream of the fuses L1 (for example the fuses of each BP pair) can be achieved.

The foregoing description of the embodiment of the invention has been presented for purposes of illustration and description It is not intended to be exhaustive or to limit the invention to the precise form disclosed Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. Apparatus for bridging a fuse of an electronic device comprising:
   a base; and
   a conductive element mounted on the base, which may be brought into contact with and bridge a fuse, so as to provide operable conductive communication between elements connected to a fuse.

2. The apparatus of claim 1 and further comprising a plurality of conductive elements mounted on the base, at least some of which may be brought into contact with and bridge a fuse.

3. The apparatus of claim 2 wherein the conductive elements are substantially parallel and in spaced-apart relation.

4. The apparatus of claim 3 wherein the base is resilient, compressive, insulating material.

5. The apparatus of claim 3 wherein the plurality of conductive elements lies within the periphery of the base.

6. The apparatus of claim 2 wherein the base is resilient compressive material.

7. The apparatus of claim 2 wherein the base is insulating material.

8. Apparatus for testing an electrical device which includes a fuse comprising:
   a thermal head;
   a base mounted on the thermal head; and
   a conductive element mounted to the base, which may be brought into contact with and bridge a fuse with the thermal head adjacent an electrical device, so as to provide operable conductive communication between elements connected to a fuse.

9. The apparatus of claim 8 and further comprising a plurality of conductive elements mounted on the base, at least some of which may be brought into contact with and bridge a fuse.

10. The apparatus of claim 9 wherein the conductive elements are substantially parallel and in spaced-apart relation.

11. The apparatus of claim 10 wherein the base is resilient, compressive, insulating material.

12. The apparatus of claim 11 wherein the plurality of conductive elements lies within the periphery of the base.

13. The apparatus of claim 12 and further comprising an electrical device which includes a fuse.

14. The apparatus of claim 13 wherein the electrical device further comprises at least one resistor operatively associated with the fuse.

* * * * *